(12) United States Patent
Park (10) Patent No.: US 9,472,259 B2
(45) Date of Patent: Oct. 18, 2016

(54) SEMICONDUCTOR MEMORY DEVICE WITH DUMMY MEMORY MAT AND REFRESH OPERATING METHOD THEREOF

(71) Applicant: SK hynix Inc., Gyeonggi-do (KR)

(72) Inventor: Ga-Ram Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/570,997

(22) Filed: Dec. 15, 2014

(65) Prior Publication Data

US 2016/0064062 A1 Mar. 3, 2016

(30) Foreign Application Priority Data

Aug. 27, 2014 (KR) .......................... 10-2014-0112377

(51) Int. Cl.
*G11C 7/00* (2006.01)
*G11C 11/406* (2006.01)
*G11C 29/00* (2006.01)

(52) U.S. Cl.
CPC ....... *G11C 11/40618* (2013.01); *G11C 29/783* (2013.01)

(58) Field of Classification Search
CPC .......... G11C 11/406; G11C 11/40618; G11C 29/783

USPC ............ 365/185.2, 185.09, 210, 222, 230.03
See application file for complete search history.

(56) References Cited

U.S. PATENT DOCUMENTS

| 2004/0022110 A1* | 2/2004 | Haraguchi | ............ G11C 29/80 365/222 |
| 2006/0098503 A1* | 5/2006 | Jeong | ................... G11C 29/808 365/200 |

FOREIGN PATENT DOCUMENTS

| KR | 1020040093818 | 11/2004 |
| KR | 1020060066876 | 6/2006 |

* cited by examiner

*Primary Examiner* — Tha-O H Bui
(74) *Attorney, Agent, or Firm* — IP & T Group LLP (57) ABSTRACT

A semiconductor memory device includes a plurality of normal memory mats, one or more of which includes a redundancy word line, a dummy memory mat suitable for performing an operation with an edge memory mat as a pair during an active operation, wherein the edge memory mat is one among the plurality of normal memory mats disposed at an edge, and a refresh control section suitable for controlling refresh operations for the plurality of normal memory mats and the dummy memory mat, and restricting activation of the redundancy word line during a refresh operation for the edge memory mat.

14 Claims, 5 Drawing Sheets

SEMICONDUCTOR MEMORY DEVICE WITH DUMMY MEMORY MAT AND REFRESH OPERATING METHOD THEREOF

CROSS-REFERENCE TO RELATED APPLICATIONS

The present application claims priority of Korean Patent Application NO. 10-2014-0112377, filed on Aug. 27, 2014, which is incorporated herein by reference in its entirety.

BACKGROUND

1. Field

Exemplary embodiments of the present invention relate to a semiconductor design technology, and more particularly, to a semiconductor memory device having an open bit line structure and a refresh operating method thereof.

2. Description of the Related Art

A semiconductor memory device, such as a double data rate synchronous dynamic random access memory (DDR SDRAM), generally has a memory bank for storing data. The memory bank is a group of unit memory cells, each of which is a basic unit for storing data. The unit memory cell is categorized into various types, e.g., 8F2 and 6F2, depending on circuit designs, which determine arrangement of bit lines. The unit memory cell of the type 8F2 has a folded bit line structure, and the unit memory cell of the type 6F2 has an open bit line structure.

In the folded bit line structure, driving bit fines for driving data, for example, positive bit lines, and reference bit lines for comparing data, for example, negative bit lines, are arranged in a memory mat with reference to a sense and amplification unit disposed to sense and amplify the data in a memory area of the semiconductor memory device. In the open bit line structure, the positive bit lines and the negative bit lines are arranged in different memory mats. The memory mat is a unit of predetermined size divided from the memory bank. The memory bank has a plurality of memory mats.

The merits and demerits of the folded bit line structure and the open bit line structure are as follows.

As described above, as to the folded bit line structure, the positive bit lines and the negative bit lines are arranged in the same memory mat, and therefore the same noise may be present on both of the positive and negative bit lines. The noise on both of the positive and negative bit lines cancel each other out, thereby securing stable operations against the noise. As to the open bit line structure, the positive bit lines and the negative bit lines are arranged in different memory mats, and therefore there may be a difference in the noise between the positive and negative bit lines, which makes the open bit line more vulnerable to noise than the folded bit line structure.

As described above, the unit memory cell of the type 8F2 has a folded bit line structure, and the unit memory cell of the type 6F2 has an open bit line structure, which means that the memory bank having the open bit line structure may be designed smaller than the memory bank having the folded bit line structure in view of the same storage capacity. In other words, there is a physical space advantage in using the open bit line structure.

Semiconductor memory devices have lots of unit memory cells, the number of which is increasing as device process technology develops and integration degree increases. When even one of the lots of unit memory cells fails, the semiconductor memory device cannot perform an operation as commanded, and thus the semiconductor memory device should be discarded. However, nowadays, failures statistically occur on only a few unit memory cells, due to increased process technology, and thus it is very inefficient to discard semiconductor memory devices because of a failure on only a few unit memory cells when considering the overall product yield. For this reason, semiconductor memory devices have redundancy memory cells as well as normal memory cells.

When normal memory cells fail, redundancy memory cells replace the failed normal memory cells, which are referred to as repair target memory cells. When the semiconductor memory device is requested to access the repair target memory cell for a read or write operation (from an external device), a normally functioning memory cell is internally accessed instead of the repair target memory cell, and the memory cell replacing the repair target memory cell is a redundancy memory cell. Therefore, when the semiconductor memory device receives an address for the repair target memory cell from an external device, the semiconductor memory device secures errorless operation through a repair operation in which the redundancy memory cell is accessed instead of the repair target memory cell.

Figure 1:
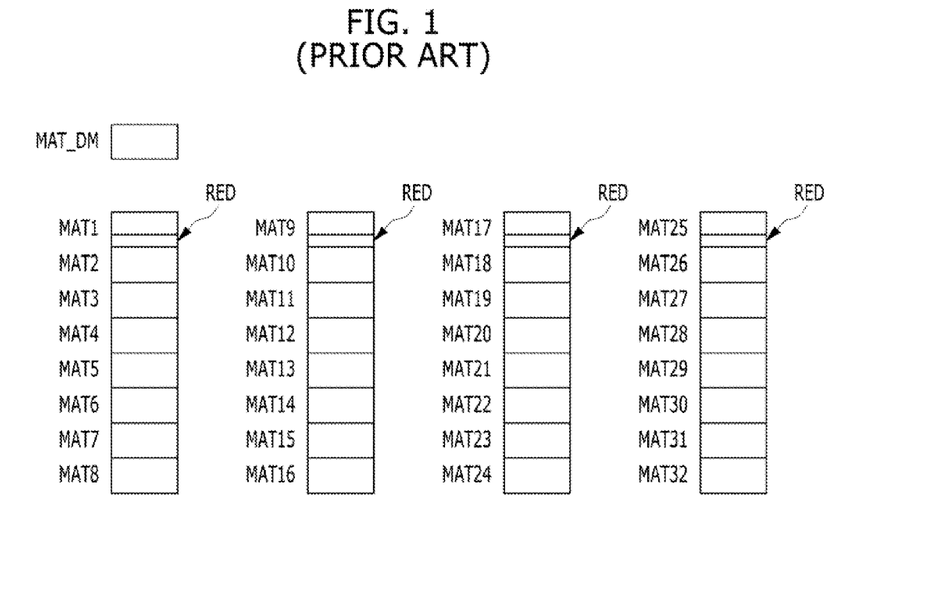
FIG. 1 is a schematic diagram illustrating a typical semiconductor memory device.

FIG. 1 is a schematic diagram illustrating a typical semiconductor memory device. For a simple description, FIG. 1 shows the semiconductor memory device having the open bit line structure, and having 32 memory mats in the memory bank.

Referring to FIG. 1, the semiconductor memory device includes $1^{st}$ to $32^{nd}$ memory mats MAT1 to MAT32, and a dummy memory mat MAT_DM. In general, there is a sense and amplification circuit between the memory mats. During the read operation, when word lines of a memory mat are activated, data of the activated memory mat is transferred to and amplified by a sense and amplification circuit corresponding to the memory mat. For example, when word lines of the $2^{nd}$ memory mat MAT2 are activated, data corresponding to the word lines of the $2^{nd}$ memory mat MAT2 is transferred to the sense and amplification circuits disposed between the $1^{st}$ and $2^{nd}$ memory mats MAT1 and MAT2, and between the $2^{nd}$ and $3^{rd}$ memory mats MAT2 and MAT3.

In the memory bank of the semiconductor memory device having the folded bit line structure, a single word line is activated during the read or write operation. As described above, in the memory bank of the semiconductor memory device having the open bit line structure, a single word line is activated during the read or write operation, which is similar to the semiconductor memory device having the folded bit line structure. However, a pair of word lines may be activated in the semiconductor memory device having the open bit line structure due to the following reason.

The memory mat of the semiconductor memory device having the open bit line structure has bit lines coupled to an upper sense and amplification circuit, which is disposed in the upper side of the memory mat, and bit lines coupled to a lower sense and amplification circuit, which is disposed in the lower side of the memory mat. Therefore, during an active operation preceding the read and write operations, when a single word line of the memory mat is activated, corresponding data is transferred to both of the upper and lower sense and amplification circuits.

However, the memory mat disposed near the border of the memory bank, for example, the $32^{nd}$ memory mat MAT32, does not have the lower sense and amplification circuit, and therefore has half the bit lines activated during the active operation compared to the other memory mats, or the $1^{st}$ to $31^{st}$ memory mats MAT1 to MAT31. Therefore, the $32^{nd}$ memory mat MAT32 should perform operations for the other half of the bit lines of the $1^{st}$ to $31^{st}$ memory mats MAT1 to MAT31 in order to keep step with the operations of the $1^{st}$ to $31^{st}$ memory mats MAT1 to MAT31.

To this end, the semiconductor memory device having the open bit line structure controls the word lines of the dummy memory mat MAT_DM to be activated at the same time when the word lines of the $32^{nd}$ memory mat MAT 32 are activated. In other words, the word lines of both of the $32^{nd}$ memory mat MAT32 and the dummy memory mat MAT_DM are activated at the same time for the activation of the $32^{nd}$ memory mat MAT32.

As described above, the memory bank of the semiconductor memory device having the open bit line structure has redundancy word lines. For example, the redundancy word lines RED are disposed in each of the $1^{st}$, $9^{th}$, $17^{th}$, and $25^{th}$ memory mats MAT1, MAT9, MAT17, and MAT25 of the semiconductor memory device shown in FIG. 1.

Figure 2:
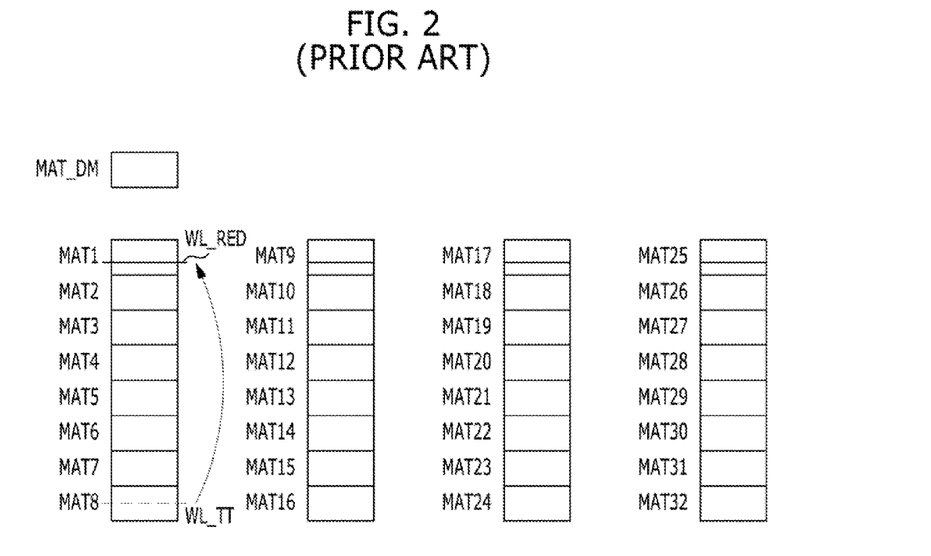
FIG. 2 is a schematic diagram illustrating a repair operation of a semiconductor memory device shown in FIG. 1.

FIG. 2 is a schematic diagram illustrating a repair operation of the semiconductor memory device shown in FIG. 1. For a simple description, the repair target memory cell in the $8^{th}$ memory mat MAT8 and the repair target memory cell is repaired by the plurality of redundancy word lines RED of the $1^{st}$ memory mat MAT1.

In this example, when the semiconductor memory device accesses a word line WL_TT corresponding to the repair target memory cell, which is referred to as a repair target word line, one WL_RED of the plurality of redundancy word lines RED is activated instead of the repair target word line WL_TT.

Figure 3:
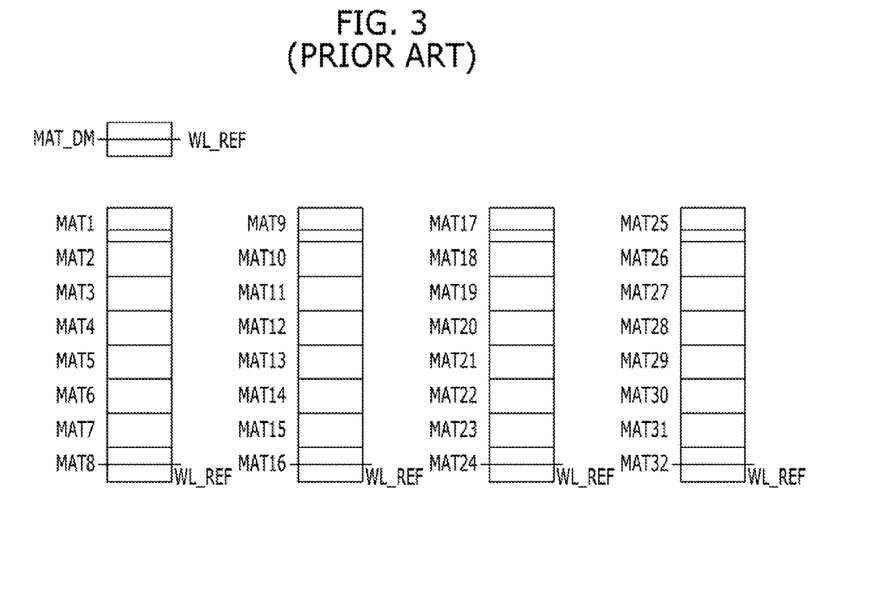
FIG. 3 is a schematic diagram illustrating a refresh operation of a semiconductor memory device shown in FIG. 1.

FIG. 3 is a schematic diagram illustrating a refresh operation of the semiconductor memory device shown in FIG. 1. For a simple description, the refresh operation is performed once per eight memory mats. For reference, the refresh operation is accompanied by the active operation, during which the word lines are activated.

The refresh operations for the $1^{st}$, $9^{th}$, $17^{th}$, and $25^{th}$ memory mats MAT1, MAT9, MAT17, and MAT25 are performed at the same time. And then, the refresh operations for the $2^{nd}$, $10^{th}$, $18^{th}$ and $26^{th}$ memory mats MAT2, MAT10, MAT18, and MAT26 are performed at the same time. The refresh operations for the group of memory mats are sequentially performed to the $8^{th}$, $16^{th}$ $24^{th}$ and $32^{nd}$ memory mats MAT8, MAT16, MAT24, and MAT32. When the refresh operations for the $8^{th}$, $16^{th}$, $24^{th}$, and $32^{nd}$ memory mats MAT8, MAT16, MAT24, and MAT32 are performed, word lines WL_REF of the dummy memory mat MAT_DM as well as the $8^{th}$, $16^{th}$ $24^{th}$, and $32^{nd}$ memory mats MAT8, MAT16, MAT24, and MAT32 are activated. In other words, during the refresh operations for the $8^{th}$, $16^{th}$, $24^{th}$, and $32^{nd}$ memory mats MAT8, MAT16, MAT24, and MAT32, there are five (5) activated word lines WL_REF.

Figure 4:
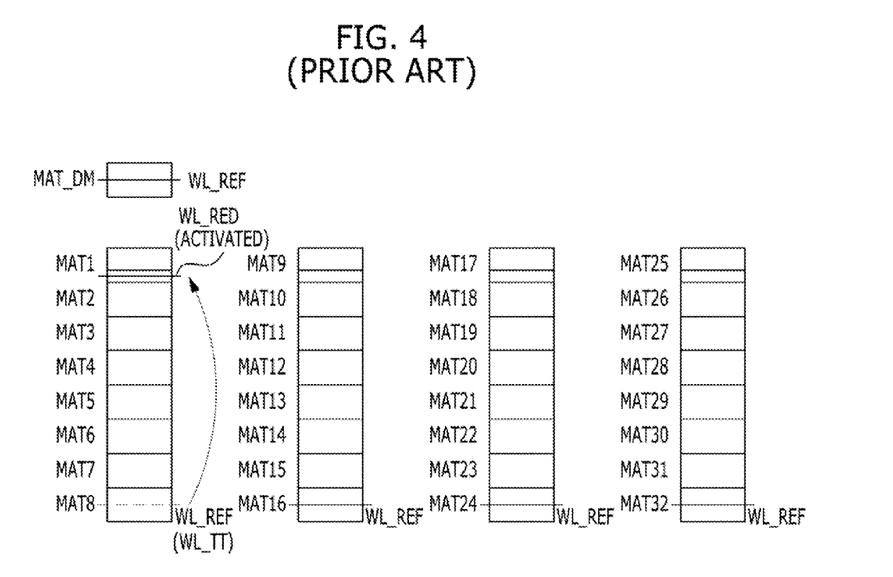
FIG. 4 is a schematic diagram illustrating a problem with the semiconductor memory device shown in FIG. 1.

FIG. 4 is a schematic diagram illustrating a problem with the semiconductor memory device shown in FIG. 1. For a simple description, the semiconductor memory device shown in FIG. 4 has been repaired as described with reference to FIG. 2, and performs the refresh operations as described with reference to FIG. 3.

Referring to FIG. 4, the semiconductor memory device performs the refresh operations for the $8^{th}$, $16^{th}$, $24^{th}$, and $32^{nd}$ memory mats MAT8, MAT16, MAT24, and MAT32 as well as the dummy memory mats MAT_DM at the same time. In other words, the word lines WL_REF of the $8^{th}$, $16^{th}$, $24^{th}$, and $32^{nd}$ memory mats MAT8, MAT16, MAT24, and MAT32 as well as the dummy memory mat MAT_DM are activated. When the word line WL_REF of the $8^{th}$ memory mat MAT8 is the repair target word line WL_TT corresponding to the repair target memory cell, the redundancy word line WL_RED of the $1^{st}$ memory mat MAT1 is activated instead of the repair target word line WL_TT of the $8^{th}$ memory mat MAT8. In other words, during the refresh operations for the $16^{th}$, $24^{th}$, and $32^{nd}$ memory mats MAT16, MAT24, and MAT32 as well as the dummy memory mat MAT_DM, the word lines WL_REF of the $16^{th}$ $24^{th}$, and $32^{nd}$ memory mats MAT16, MAT24, and MAT32 as well as the dummy memory mat MAT_DM are activated, and the redundancy word line WL_RED of the $1^{st}$ memory mat MAT1 is activated as the repair operation for the repair target word line WL_TT of the $8^{th}$ memory mat MAT8.

As described above, the dummy memory mat MAT_DM uses the lower sense and amplification circuit, and the $1^{st}$ memory mat MAT1 uses the upper sense and amplification circuit. In other words, a situation may come in which the dummy memory mat MAT_DM and the $1^{st}$ memory mat MAT1 uses the same sense and amplification circuit at the same time. In this situation, there is data collision between the dummy memory mat MAT_DM and the $1^{st}$ memory mat MAT. The data collision may disturb the stable refresh operation of the semiconductor memory device. To sum up, the semiconductor memory device may malfunction when performing the refresh operation after the repair operation.

SUMMARY

Various embodiments of the present invention are directed to a semiconductor memory device having an open bit line structure that is capable of performing stable repair and refresh operations.

In accordance with an exemplary embodiment of the present invention, a semiconductor memory device may include a plurality of normal memory mats, one or more of which includes a redundancy word line; a dummy memory mat suitable for performing an operation with an edge memory mat as a pair during an active operation, wherein the edge memory mat is one among the plurality of normal memory mats disposed at an edge; and a refresh control section suitable for controlling refresh operations for the plurality of normal memory mats and the dummy memory mat, and restricting activation of the redundancy word line during a refresh operation for the edge memory mat.

Two or more among the plurality of normal memory mats may be activated at the same time during the refresh operations for the plurality of normal memory mats.

The refresh control section may include a refresh address generation unit suitable for generating a refresh address during the refresh operations for the plurality of normal memory mats and the dummy memory mat; an activation control unit suitable for generating an activation control signal in response to the refresh address corresponding to the edge memory mat; and a refresh driving unit suitable for selectively activating the plurality of normal memory mats in response to the refresh address and restricting activation of the plurality of normal memory mats in response to the activation control signal.

The refresh control section may control the refresh operations for the plurality of normal memory mats, and control the activation of the redundancy word line in response to repair information.

The refresh controls section may control the refresh operations for the plurality of normal memory mats, and then control an additional refresh operation in response to the repair information.

The additional refresh operation may include a refresh operation for the redundancy word line corresponding to one among the plurality of normal memory mats, where a refresh operation for the one among the plurality of normal memory mats is performed at the same time as the refresh operation for the edge memory mat.

The one or more of the plurality of normal memory mats may include the redundancy word line, and the dummy memory mat share a sense and amplification circuit.

In accordance with an exemplary embodiment of the present invention, a refresh operation method of a semiconductor memory device may include performing refresh operations for a plurality of normal memory mats; restricting activation of a redundancy word line during a refresh operation for an edge memory mat in the performing of the refresh operations for the plurality of normal memory mats, wherein the edge memory mat is one among the plurality of normal memory mats disposed at an edge; and performing an additional refresh operation for the redundancy word line after the restricting of the activation of the redundancy word line.

The performing of the refresh operations may include activating two or more among the plurality of normal memory mats at the same time.

The performing of the refresh operations may include performing a refresh operation for a redundancy word line corresponding to one among the plurality of normal memory mats, wherein a refresh operation for the one among the plurality of normal memory mats is performed at a different time from the refresh operation for the edge memory mat.

The performing of the refresh operations may be determined based on repair information of the edge memory mat.

The performing of the additional refresh operation may include performing a refresh operation for a redundancy word line corresponding to one among the plurality of normal memory mats, wherein a refresh operation for the one among the plurality of normal memory mats is performed at the same time as the refresh operation for the edge memory mat.

In accordance with an exemplary embodiment of the present invention, a semiconductor memory system may include a semiconductor memory device including: a plurality of normal memory mats, one or more of which includes a redundancy word line; a dummy memory mat suitable for performing an operation with an edge memory mat as a pair during an active operation, wherein the edge memory mat is one among the plurality of normal memory mats disposed at an edge; and a refresh control section suitable for controlling refresh operations for the plurality of normal memory mats and the dummy memory mat, and restricting activation of the redundancy word line during a refresh operation for the edge memory mat; and a controller suitable for controlling an activating time point of a refresh operation based on first information on a number of repairs of the semiconductor memory device and second information on a memory mat structure of the semiconductor memory device.

The semiconductor memory device may perform a normal refresh operation and an additional refresh operation in response to the first information and the second information.

The controller may generate and provide refresh commands for the normal refresh operation and the additional refresh operation to the semiconductor memory device.

The number of repairs may include a number of redundancy word lines corresponding to one among the plurality of normal memory mats, wherein a refresh operation for the one among the plurality of normal memory mats is performed at the same time as the refresh operation for the edge memory mat.

In accordance with an exemplary embodiment of the present invention, a refresh control method of a semiconductor memory system may include determining a normal refresh command time section and an additional refresh command time section; enabling a refresh command repeatedly with a first time interval during the normal refresh command time section; enabling the refresh command repeatedly with a second time interval during the additional refresh command time section; and performing a refresh operation in response to the refresh command.

The first and second time intervals may be variable based on a number of repairs.

The refresh commands may be repeatedly enabled a predetermined number of times during the normal refresh command time section, and wherein the refresh commands are repeatedly enabled a number of times corresponding to the number of repairs during the additional refresh command time section.

In accordance with an exemplary embodiment of the present invention, the semiconductor memory device having the open bit line structure may perform stable repair and refresh operations. Particularly, the semiconductor memory device having the open bit line structure may restrict activation of a redundancy word line when an edge memory mat performing an operation with a dummy memory mat is activated.

In accordance with an exemplary embodiment of the present invention, the semiconductor memory device having the open bit line structure may raise data reliability despite of long term data storage by securing a stable refresh operation after a repair operation.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete and will fully convey the scope of the present invention to those skilled in the art.

The drawings are not necessarily to scale and, in some instances, proportions may have been exaggerated in order to clearly illustrate features of the embodiments. Throughout the disclosure, like reference numerals correspond directly to the like parts in the various figures and embodiments of the present invention. It is also noted that in this specification, "connected/coupled" refers to one component not only directly coupling another component but also indirectly coupling another component through an intermediate component. In addition, a singular form may include the plural form as long as it is not specifically mentioned in a sentence. It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween. When a first layer is referred to as being "on" a second layer or "on" a substrate, it not only refers to a case where the first layer is formed directly on the second layer or the substrate but also a case where a third layer exists between the first layer and the second layer or the substrate.

Figure 5:
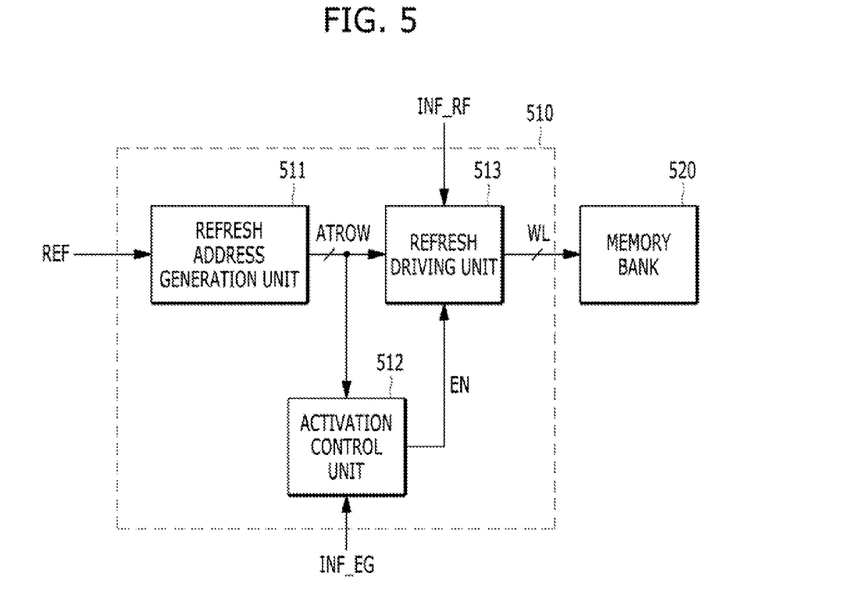
FIG. 5 is a block diagram illustrating a semiconductor memory device in accordance with an exemplary embodiment of the present invention.

FIG. 5 is a block diagram illustrating a semiconductor memory device in accordance with an exemplary embodiment of the present invention.

Referring to FIG. 5, the semiconductor memory device may include a refresh control section 510 and a memory bank 520.

The refresh control section 510 may control a refresh operation of the memory bank 520, and may include a refresh address generation unit 511, an activation control unit 512, and a refresh driving unit 513.

The refresh address generation unit 511 may generate a refresh address ATROW in response to a refresh command REF. The refresh command REF may be enabled during the refresh operation, and it may be inputted from an external (e.g. an external source or device), or may be internally generated.

The activation control unit 512 may generate an activation control signal EN in response to the refresh address ATROW corresponding to edge memory mat information INF_EG. The edge memory mat information INF_EG may correspond to a memory mat performing operations with a dummy memory mat MAT_DM as a pair, which will be described later in detail.

The refresh driving unit 513 may selectively activate a plurality of word lines WL in response to the refresh address ATROW. Repair information INF_RF may be reflected to selectively activate the plurality of word lines WL. For example, the repair information INF_RF may be information about the repair target memory cell of the $8^{th}$ memory mat MAT8 shown in FIGS. 1 to 4. The refresh driving unit 513 may restrict the activation of redundancy word lines WL_RED in response to the activation control signal EN.

The memory bank 520 may include a plurality of memory mats as described with reference to FIGS. 1 to 4, and which will be described later in detail. Each of the plurality of memory mats may have a plurality of word lines WL.

Figure 6:
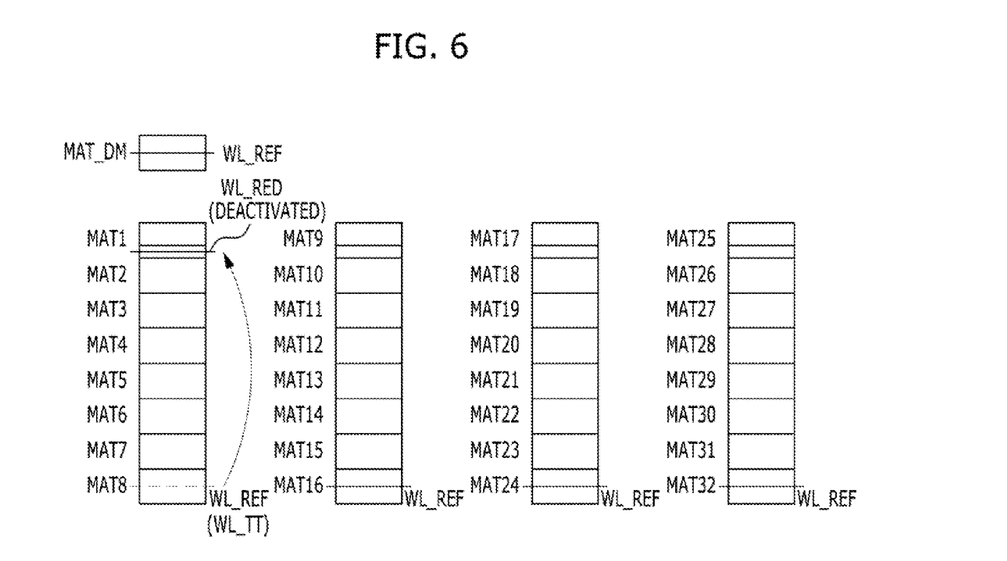
FIG. 6 is a schematic diagram illustrating a refresh operation of a semiconductor memory device shown in FIG. 5.

FIG. 6 is a schematic diagram illustrating a refresh operation of a semiconductor memory device shown in FIG. 5. For a simple example, the semiconductor memory device shown in FIG. 6 has been repaired as described with reference to FIG. 2, and performs the refresh operations as described with reference to FIG. 3. In other words, the refresh operation is performed once per eight memory mats.

Referring to FIG. 6, the semiconductor memory device having the open bit line structure may perform the refresh operations for the $8^{th}$, $16^{th}$, $24^{th}$, and $32^{nd}$ memory mats MAT8, MAT16, MAT24, and MAT32 as well as the dummy memory mats MAT_DM at the same time. In other words, the word lines WL_REF of the $8^{th}$, $16^{th}$, $24^{th}$, and $32^{nd}$ memory mats MAT8, MAT16, MAT24, and MAT32 as well as the dummy memory mat MAT_DM may be activated.

According to the prior art, when the word line WL_REF of the $8^{th}$ memory mat MAT8 is the repair target word line WL_TT corresponding to the repair target memory cell, the redundancy word line WL_RED of the $1^{st}$ memory mat MAT1 should be activated instead of the repair target word line WL_TT of the $8^{th}$ memory mat MAT8. In other words, during the refresh operations for the $16^{th}$, $24^{th}$, and $32^{nd}$ memory mats MAT16, MAT24, and MAT32 as well as the dummy memory mat MAT_DM the word lines WL_REF of the $16^{th}$, $24^{th}$, and $32^{nd}$ memory mats MAT16, MAT24, and MAT32 as well as the dummy memory mat MAT_DM are activated, and the redundancy word line WL_RED of the $1^{st}$ memory mat MAT1 should be activated as the repair operation for the repair target word line WL_TT of the $8^{th}$ memory mat MAT8.

However, in accordance with an exemplary embodiment of the present invention, the semiconductor memory device having the open bit line structure may restrict the activation operation of the redundancy word line WL_RED of the $1^{st}$ memory mat MAT1 based on the activation control signal EN generated by the activation control unit 512 described above with reference to FIG. 5.

Referring back to FIG. 5, the activation control unit 512 may generate the activation control signal EN in response to the refresh address ATROW corresponding to the edge memory mat information INF_EG. For example, the edge memory mat information INF_EG may be information corresponding to the 32 memory mat MAT32 performing operations with a dummy memory mat MAT_DM as a pair. The refresh driving unit 513 may restrict the activation operation of the redundancy word lines WL_RED in response to the activation control signal EN.

In other words, during the refresh operations, the semiconductor memory device having the open bit line structure may activate the $8^{th}$, $16^{th}$, $24^{th}$, and $32^{nd}$ memory mats MAT8, MAT16, MAT24, and MAT32 as well as the dummy memory mats MAT_DM at the same time. In other words, the word lines WL_REF of the $8^{th}$, $16^{th}$, $24^{th}$, and $32^{nd}$ memory mats MAT8, MAT16, MAT24, and MAT32 as well as the dummy memory mat MAT_DM may be activated.

At this time, when the word line WL_REF of the $8^{th}$ memory mat MAT8 is the repair target word line WL_TT corresponding to the repair target memory cell, the redundancy word line WL_RED of the $1^{st}$ memory mat MAT1 replaces the repair target word line WL_TT of the $8^{th}$ memory mat MAT8, and should be activated instead of the repair target word line WL_TT of the $8^{th}$ memory mat MAT8.

However, in accordance with an exemplary embodiment of the present invention, the semiconductor memory device having the open bit line structure may restrict the activation operation of the redundancy word line WL_RED of the $1^{st}$ memory mat MAT1 based on the activation control signal EN generated by the activation control unit 512. Eventually, during the refresh operations, the semiconductor memory device having the open bit line structure may activate the $16^{th}$ $24^{th}$, and $32^{d}$ memory mats MAT16, MAT24, and MAT32 as well as the dummy memory mats MAT_DM at the same time while not activating the $1^{st}$ memory mat MAT1 having the redundancy word line WL_RED corresponding to the repair target word line WL_TT of the 8th memory mats MAT8.

In accordance with an exemplary embodiment of the present invention, the semiconductor memory device having the open bit line structure may restrict the activation of the redundancy word line WL_RED for the repair operation by restricting the activation of the memory mat having the redundancy word line WL_RED when the memory mat corresponding to the edge memory mat information INF_EG is activated.

Figure 7:
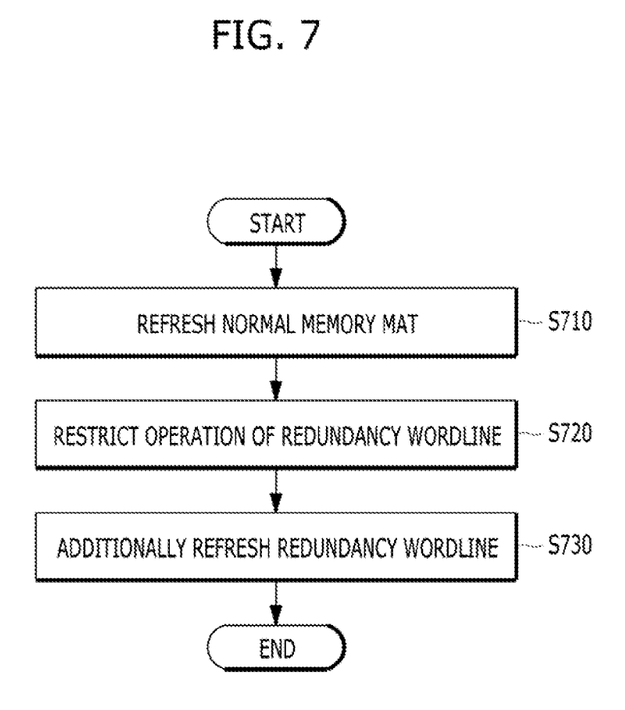
FIG. 7 is a flow chart illustrating a refresh operation of a semiconductor memory device shown in FIG. 5 in accordance with an exemplary embodiment of the present invention.

FIG. 7 is a flow chart illustrating a refresh operation of a semiconductor memory device shown in FIG. 5 accordance with an exemplary embodiment of the present invention.

Referring to FIG. 7, the refresh operation of the semiconductor memory device having the open bit line structure may include refreshing a normal memory mat S710, restricting the operation of the redundancy word line S720, and refreshing the redundancy word line S730.

At the step S710, the semiconductor memory device having the open bit line structure may refresh the normal memory mat. The normal memory mat may mean the $1^{st}$ to $32^{nd}$ memory mats MAT1 to MAT32 as well as the dummy memory mat MAT_DM described above with reference to FIG. 6.

At the step S720, the semiconductor memory device having the open bit line structure may restrict the activation of the redundancy word lines. During the refresh operation of the $32^{nd}$ memory mat MAT32, which is the edge memory mat, the semiconductor memory device having the open bit line structure may restrict the activation of the redundancy word line WL_RED corresponding to the repair target word line WL_TT of the $8^{th}$ memory mat MAT8. That is, the semiconductor memory device having the open bit line structure may restrict the activation of the $1^{st}$ memory mat MAT1 having the redundancy word line WL_RED corresponding to the repair target word line WL_TT of the $8^{th}$ memory mat MAT8, and this means the semiconductor memory device having the open bit line structure may restrict the activation of the $1^{st}$ memory mat MAT1 sharing the sense and amplification circuit with the dummy memory mat MAT_DM when the dummy memory mat MAT_DM is activated.

At the step S730, the semiconductor memory device having the open bit line structure may perform additional refresh operations on the redundancy word line. The semiconductor memory device having the open bit line structure may perform the additional refresh operation on the redundancy word line WL_RED, the activation of which is restricted at the step S720, and which is therefore deactivated.

The refresh operating method of the semiconductor memory device having the open bit line structure will be described with reference to FIGS. 6 and 7.

The refresh operations for the $1^{st}$, $9^{th}$, $17^{th}$ and $25^{th}$ memory mats MAT1, MAT9, MAT17, and MAT25 may be performed at the same time. And then, the refresh operations for the $2^{nd}$ $10^{th}$, $18^{th}$ and $26^{th}$ memory mats MAT2, MAT10, MAT18, and MAT26 may be performed at the same time. There may be the repair target memory cell in each of the $1^{st}$ to $30^{th}$ memory mats MAT1 to MAT30 during the refresh operations of the $1^{st}$ to $30^{th}$ memory mats MAT1 to MAT30. In this case, the semiconductor memory device having, the open bit line structure may perform the repair operations for the repair target memory cell with the redundancy word line WL_RED corresponding to each of the $1^{st}$ to $30^{th}$ memory mats MAT1 to MAT30. These refresh operations and repair operations may be included in the step S710.

After the step S710, the semiconductor memory device having the open bit line structure may perform the refresh operations for the 8th, $16^{th}$, $24^{th}$, and $32^{nd}$ memory mats MAT8, MAT16, MAT24, and MAT32. At this time, the activation control unit 512 may generate the activation control signal EN in response to the refresh address ATROW corresponding to the edge memory mat information INF_EG. The edge memory mat information INF_EG may correspond to the $32^{nd}$ memory mat MAT32 performing operations with the dummy memory mat MAT_DM. The refresh driving unit 513 may restrict the activation of the redundancy word line WL_RED of the $1^{st}$ memory mat MAT1 in response to the activation control signal EN even though there is the repair target memory cell in the $8^{th}$ memory mat. MAT8, and the repair target word line WL_TT of the $8^{th}$ memory mat MAT8 is replaced by the redundancy word line WL_RED of the $1^{st}$ memory mat MAT1. This restriction operation may be included in the step S720. As shown in FIG. 6, the redundancy word line WL_RED of the $1^{st}$ memory mat MAT1, which replaces the repair target word line WL_TT of the $8^{th}$ memory mat MAT8, may be deactivated.

After the step S720 where all the refresh operations for the $1^{st}$ to $32^{nd}$ memory mats MAT1 to MAT32 are performed, the semiconductor memory device having the open bit line structure may perform the additional refresh operation for the redundancy word line WL_RED of the $1^{st}$ memory mat MAT1, which replaces the repair target word line WL_TT of the $8^{th}$ memory mat MAT8, and the activation of which is restricted at the step S720. The additional refresh operation may be included in the step S730.

The step S730 may be controlled by various elements depending on circuit designs. The step S730 may be controlled by the refresh address generation unit 511 or the refresh driving unit 513.

If the step S730 is controlled by the refresh address generation unit 511, the refresh address generation unit 511 may firstly generate the refresh address ATROW for the refresh operations for the $1^{st}$ to $32^{nd}$ memory mats MAT1 to MAT32, and then may generate the refresh address ATROW for the additional refresh operation for the redundancy word line WL_RED of the $1^{st}$ memory mat MAT1, which replaces the repair target word line WL_TT of the $8^{th}$ memory mat MAT8.

After that, the refresh address generation unit 511 may generate the refresh address ATROW again for the refresh operations for the $1^{st}$ to $32^{nd}$ memory mats MAT1 to MAT32.

The refresh address generation unit 511 may receive repair information INF_RF shown in FIG. 5, which includes information on the repair target memory cell of the $8^{th}$ memory mat MAT8, in order to perform the additional refresh operation of the step S730.

If the step S730 is controlled by the refresh driving unit 513, the refresh driving unit 513 may perform the refresh operations for the $1^{st}$ to $32^{nd}$ memory mats MAT1 to MAT32 in response to the refresh address ATROW provided from the refresh address generation unit 511, and then may perform the additional refresh operation for the redundancy word line WL_RED of the $1^{st}$ memory mat MAT1, which replaces the repair target word line WL_TT of the $8^{th}$ memory mat MAT8, in response to the repair information INF_RF.

In this case, the semiconductor memory device having the open bit line structure may control the refresh address generation unit 511 to stop generating the refresh address ATROW during the additional refresh operation. After that, the refresh address generation unit 511 may generate the refresh address ATROW again for the refresh operations for the $1^{st}$ to $32^{nd}$ memory mats MAT1 to MAT32.

To sum up, in accordance with an exemplary embodiment of the present invention, the semiconductor memory device having the open bit line structure may perform the refresh operations for the $1^{st}$ to $32^{nd}$ memory mats MAT1 to MAT32, which are the plurality of normal memory mats, and then may perform the additional refresh operation for the redundancy word line WL_RED of the $1^{st}$ memory mat MAT1, which replaces the repair target word line WL_TT of the $8^{th}$ memory mat MAT8, and the activation of which is restricted. In other words, the additional refresh operation may be performed for the redundancy word line WL_RED corresponding to the repair target word line WL_TT of the repair target memory cell.

Figure 8:
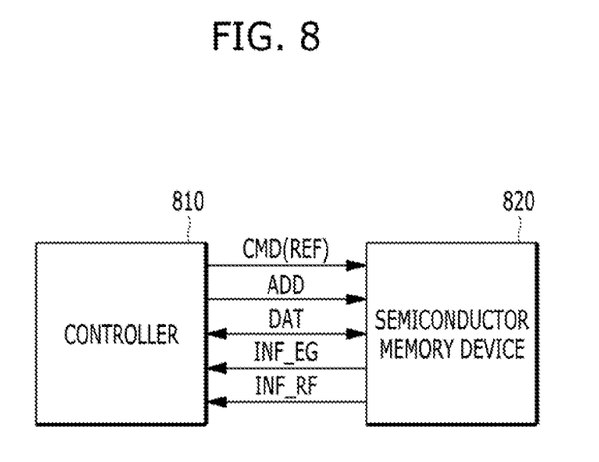
FIG. 8 is a block diagram illustrating a semiconductor memory system in accordance with an exemplary embodiment of the present invention.

FIG. 8 is a block diagram illustrating a semiconductor memory system in accordance with an exemplary embodiment of the present invention.

Referring to FIG. 8, the semiconductor memory system may include a controller 810 and a semiconductor memory device 820.

The controller 810 may store data DAT in the semiconductor memory device 820, and may read the stored data DAT from the semiconductor memory device 820. The controller 810 may generate and provide a command CMD, an address ADD, and the data DAT to the semiconductor memory device 820.

The semiconductor memory device 820 may store the data DAT from the controller 810, and may provide the data DAT to the controller 810 in response to the command CMD and the address ADD. The write operation for storing the data DAT into the semiconductor memory device 820, and the read operation for reading the stored data DAT from the semiconductor memory device 820 may be defined by the command CMD, which may include a signal REF corresponding to the refresh operation.

The semiconductor memory device 820 may be the same as the semiconductor memory device having the open bit line structure described above with reference to FIGS. 1 to 7. In other words, the semiconductor memory device 820 may perform the refresh operations for the $1^{st}$ to $32^{nd}$ memory mats MAT1 to MAT32, which are the plurality of normal memory mats, and then may perform the additional refresh operation for the redundancy word line WL_RED of the $1^{st}$ memory mat MAT1, which replaces the repair target word line WL_TT of the $8^{th}$ memory mat MAT8, and the activation of which is restricted.

In accordance with an exemplary embodiment of the present invention, the semiconductor memory device 820 may provide the repair information INF_RF and the edge memory mat information INF_EG to the controller 810. The repair information INF_RF may mean the number of repaired word lines, particularly the number of redundancy word lines WL_RED of the $1^{st}$ memory mat MAT1, which replace the repair target word lines WL_TT of the $8^{th}$ memory mat MAT8 through the repair operation. The edge memory mat information INF_EG may be the information corresponding to the memory mat performing operations with the dummy memory mat MAT_DM as a pair, for example, the $32^{nd}$ memory mat MAT32 described above with reference to FIG. 6.

In accordance with an exemplary embodiment of the present invention, the semiconductor memory system may control the activation of the refresh operation based on the repair information INF_RF and the edge memory mat information INF_EG provided from the semiconductor memory device 820.

Figure 9:
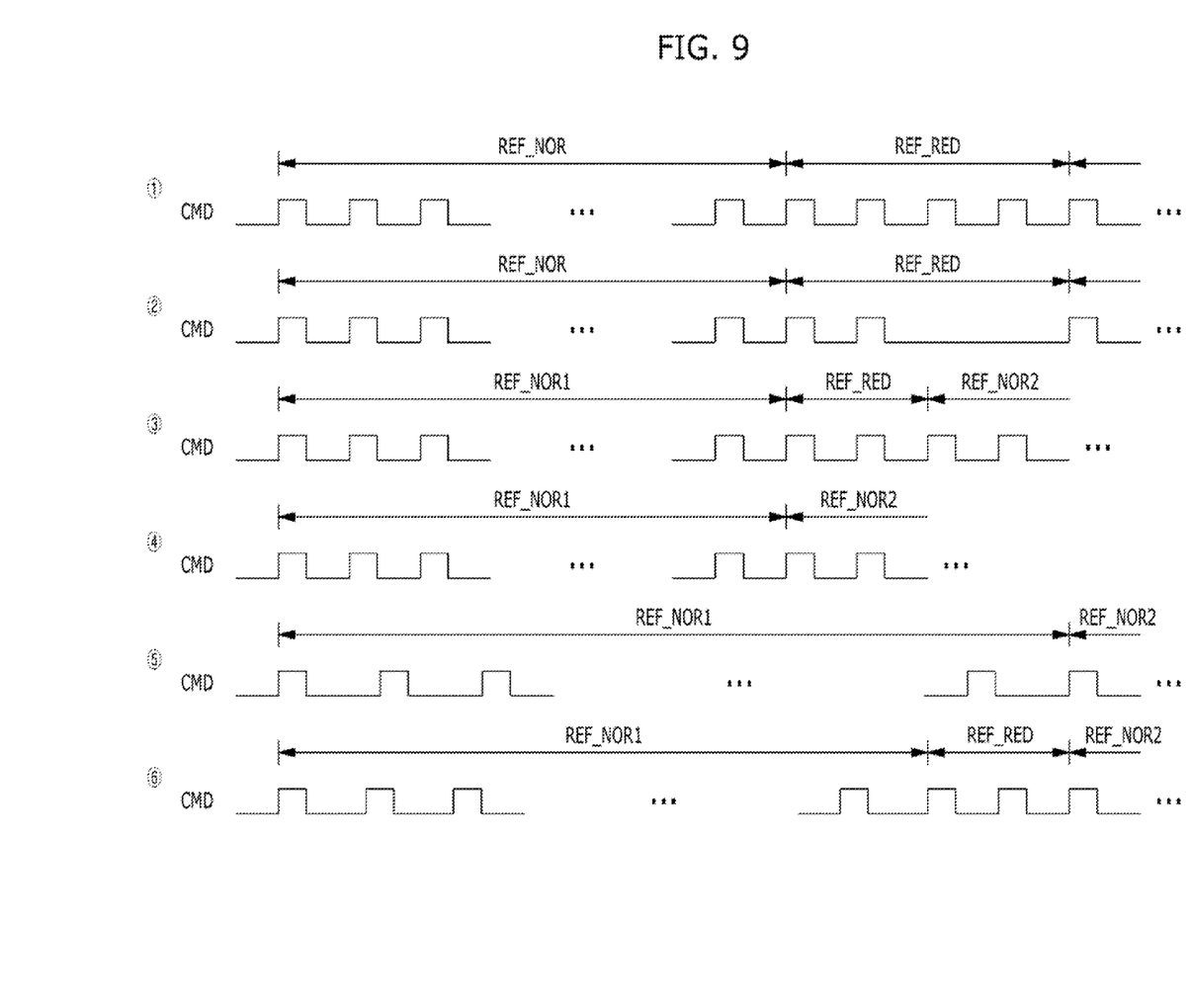
FIG. 9 is a timing diagram illustrating a refresh operation of a semiconductor memory system shown in FIG. 8.

FIG. 9 is a timing diagram illustrating a refresh operation of a semiconductor memory system shown in FIG. 8. For a simple example, the refresh operation is performed once per eight memory mats, and the edge memory mat information INF_EG represents the $32^{nd}$ memory mat MAT32, and the maximum number of the repair target memory cells of the $8^{th}$ memory mat MAT8 is 4.

As, described above, the semiconductor memory system may control the activation of the refresh operation based on the repair information INF_RF and the edge memory mat information INF_EG provided from the semiconductor memory device 820. Hereinafter, the activation time point of the command CMD during the refresh operation, which is different in each situation, will be discussed with reference to FIGS. 6, 8 and 9.

Timing diagram ① shows where the repair information INF_RF represents 4, which means that there are 4 repair target memory cells in the $8^{th}$ memory mat MAT8, and that therefore 4 redundancy word lines WL_RED of the $1^{st}$ memory mat MAT1 may be activated. The controller 810 may generate the commands CMD corresponding to the refresh operations for the $1^{st}$ to $32^{nd}$ memory mats MAT1 to MAT32, or the commands CMD activated during a normal refresh command time section REF_NOR, and then may generate the commands CMD corresponding to the additional refresh operations for the redundancy word line WL_RED of the $1^{st}$ memory mat MAT1, or the commands CMD activated during an additional refresh command time section REF_RED. As shown in the timing diagram ①, the number of the commands CMD activated during the additional refresh command time section REF_RED is 4 based on the repair information INF_RF.

Timing diagram ② shows where the repair information INF_RF is 2. As shown in the timing diagram ② the number of the commands CMD activated during the additional refresh command time section REF_RED is 2 based on the repair information INF_RF after activation of the commands CMD during the normal refresh command time section REF_NOR.

As described as an example above, the maximum number of the repair target memory cells of the $8^{th}$ memory mat MAT8 is 4. Therefore, when the normal refresh command time section REF_NOR and the additional refresh command time section REF_RED are fixed, the timing point of the activation of the commands CMD during the additional refresh command time section REF_RED may be controlled the same as the cases of the timing diagrams ① and ②.

Timing diagram ③ shows where the repair information INF_RF is 2, which is the same as in the timing diagram ②. However, the additional refresh command time section REF_RED is variable in the timing diagram ③. As shown in the timing diagram ③, the commands CMD for refresh operations for the normal $1^{st}$ to $32^{nd}$ memory mats MAT1 to MAT32 may be activated in a first normal refresh command time section REF_NOR1, and then the command CMD for refresh operations for the redundancy word line WL_RED of the $1^{st}$ memory mat MAT1 are activated in the additional refresh command time section REF_RED. The commands CMD for refresh operations for the normal $1^{st}$ to $32^{nd}$ memory mats MAT1 to MAT32 may be activated again in a second normal refresh coma and time section REF_NOR2.

The first normal refresh command time section REF_NOR1 may lead the additional refresh command time section REF_RED, and the second normal refresh command time section REF_NOR2 may follow the additional refresh command time section REF_RED. In timing diagram ③, the commands CMD activated during the first normal refresh command time section REF_NOR1, the additional refresh command time section REF_RED, and the second normal refresh command time section REF_NOR2 may have the same interval between one another.

Timing diagram ④ shows where the repair information INF_RF is 0. As shown in the timing diagram ④, the commands CMD for refresh operations for the normal $1^{st}$ to $32^{nd}$ memory mats MAT1 to MAT32 may be activated during the first normal refresh command time section REF_NOR1, and then may be activated again during the second normal refresh command time section REF_NOR2 without the additional refresh command time section REF_RED. Timing diagram may correspond to the refresh operations of the existing semiconductor memory device.

Timing diagram ⑤ shows where the repair information INF_RF is 0, and the first normal refresh command time section REF_NOR1 corresponds to the normal refresh command time section REF_NOR and the additional refresh command time section REF_RED of timing diagram ②. As shown in timing diagram ⑤, the additional duration of the first normal refresh command time section REF_NOR1 may be secured, which means that the interval between the commands CMD for refresh operations for the normal $1^{st}$ to $32^{nd}$ memory mats MAT1 to MAT32 may be controlled to become longer, and means that more operations other than the refresh operation may be performed between the commands CMD for refresh operations for the normal $1^{st}$ to $32^{nd}$ memory mats MAT1 to MAT32.

Timing diagram ⑥ shows where the repair information INF_RF is 2, which is the same as timing diagram ②. As shown in the timing diagram ⑥, the number of the commands CMD activated during the additional refresh command time section REF_RED is 2 the same as the timing diagram ②. However, compared to timing diagram ②, there may be no idle time during the additional refresh command time section REF_RED in timing diagram ⑥. Therefore, compared to timing diagram ②, the additional duration of the first normal refresh command time section REF_NOR1 may be secured in timing diagram ⑥, which means that the interval between the commands CMD for refresh operations for the normal $1^{st}$ to $32^{nd}$ memory mats MAT1 to MAT32 may be controlled to become longer, and means that more operations other than the refresh operation may be performed between the commands CMD for refresh operations for the normal $1^{st}$ to $32^{nd}$ memory mats MAT1 to MAT32.

FIG. 9 exemplarily shows where the intervals between the commands CMD for the refresh operations for the normal $1^{st}$ to $32^{nd}$ memory mats MAT1 to MAT32 is controlled based on the repair information INF_RF during the normal refresh command time section REF_NOR. However, in accordance with an exemplary embodiment of the present invention, the intervals between the commands CMD for the refresh operations for the redundancy word line WL_RED of the $1^{st}$ memory mat MAT1 may also be controlled based on the repair information INF_RF during the additional refresh command time section REF_RED.

In accordance with an exemplary embodiment of the present invention, the semiconductor memory system may control the activation of the refresh operation based on the repair information INF_RF and the edge memory mat information INF_EG provided from the semiconductor memory device 820. Particularly, the additional normal refresh command time section REF_NOR may be secured based on the repair information INF_RF thereby flexibly performing more operations other than the refresh operation between the commands CMD for refresh operations for the normal $1^{st}$ to $32^{nd}$ memory mats MAT1 to MAT32 during the normal refresh command time section REF_NOR.

As described above, in accordance with an exemplary embodiment of the present invention, the semiconductor memory device may restrict the activation of the redundancy word line, and may control the activation of the refresh operation based on the repair information INF_RF and the edge memory mat information INF_EG. In accordance with an exemplary embodiment of the present invention, the refresh operation may be stably performed, which leads to longer storage of data. The refresh operation may be performed even after the repair operation.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device comprising:
a plurality of normal memory mats, one or more of which includes a redundancy word line;
a dummy memory mat that performs an operation with an edge memory mat as a pair during an active operation, wherein the edge memory mat is one among the plurality of normal memory mats disposed at an edge; and
a refresh control section that controls refresh operations for the plurality of normal memory mats and the dummy memory mat, and restricting activation of the redundancy word line during a refresh operation for the edge memory mat,
wherein the refresh control section comprises:
a refresh address generation unit that generates a refresh address during the refresh operations for the plurality of normal memory mats and the dummy memory mat;
an activation control unit that generates an activation control signal in response to the refresh address corresponding to the edge memory mat; and
a refresh driving unit that selectively activates the plurality of normal memory mats in response to the refresh address and restricts activation of the plurality of normal memory mats in response to the activation control signal.

2. The semiconductor memory device of claim 1, wherein two or more among the plurality of normal memory mats are activated at the same time during the refresh operations for the plurality of normal memory mats.

3. The semiconductor memory device of claim 1, wherein the refresh control section controls the refresh operations for the plurality of normal memory mats, and controls the activation of the redundancy word line in response to repair information.

4. The semiconductor memory device of claim 3, wherein the refresh controls section controls the refresh operations for the plurality of normal memory mats, and then controls an additional refresh operation in response to the repair information.

5. The semiconductor memory device of claim 4, wherein the additional refresh operation includes a refresh operation for the redundancy word line corresponding to one among the plurality of normal memory mats, where a refresh operation for the one among the plurality of normal memory mats is performed at the same time as the refresh operation for the edge memory mat.

6. The semiconductor memory device of claim 1, wherein the one or more of the plurality of normal memory mats including the redundancy word line, and the dummy memory mat share a sense and amplification circuit.

7. A refresh operation method of a semiconductor memory device comprising:
performing refresh operations for a plurality of normal memory mats;
restricting activation of a redundancy word line during a refresh operation for an edge memory mat in the performing of the refresh operations for the plurality of normal memory mats, wherein the edge memory mat is one among the plurality of normal memory mats disposed at an edge; and
performing an additional refresh operation for the redundancy word line after the restricting of the activation of the redundancy word line,
wherein the performing of the refresh operations includes:
performing a refresh operation for a redundancy word line corresponding to one among the plurality of normal memory mats, wherein a refresh operation for the one among the plurality of normal memory mats is performed at a different time from the refresh operation for the edge memory mat.

8. The refresh operation method of claim 7, wherein the performing of the refresh operations includes:
activating two or more among the plurality of normal memory mats at the same time.

9. The refresh operation method of claim 7, wherein the performing of the refresh operations is determined based on repair information of the edge memory mat.

10. The refresh operation method of claim 7, wherein the performing of the additional refresh operation includes:
performing a refresh operation for a redundancy word line corresponding to one among the plurality of normal memory mats, wherein a refresh operation for the one among the plurality of normal memory mats is performed at the same time as the refresh operation for the edge memory mat.

11. A semiconductor memory system comprising:
a semiconductor memory device including:
a plurality of normal memory mats, one or more of which includes a redundancy word line;
a dummy memory mat that performs an operation with an edge memory mat as a pair during an active operation, wherein the edge memory mat is one among the plurality of normal memory mats disposed at an edge; and
a refresh control section that controls refresh operations for the plurality of normal memory mats and the dummy memory mat, and restricting activation of the redundancy word line during a refresh operation for the edge memory mat; and
a controller that controls an activating time point of a refresh operation based on first information on a number of repairs of the semiconductor memory device and second information on a memory mat structure of the semiconductor memory device,
wherein the refresh control section comprises:
a refresh address generation unit that generates a refresh address during the refresh operations for the plurality of normal memory mats and the dummy memory mat;
an activation control unit that generates an activation control signal in response to the refresh address corresponding to the edge memory mat; and
a refresh driving unit that selectively activates the plurality of normal memory mats in response to the refresh address and restricts activation of the plurality of normal memory mats in response to the activation control signal.

12. The semiconductor memory system of claim 11, wherein the semiconductor memory device performs a normal refresh operation and an additional refresh operation in response to the first information and the second information.

13. The semiconductor memory system of claim 12, wherein the controller generates and provides refresh commands for the normal refresh operation and the additional refresh operation to the semiconductor memory device.

14. The semiconductor memory system of claim 11, wherein the number of repairs includes a number of redundancy word lines corresponding to one among the plurality of normal memory mats, wherein a refresh operation for the one among the plurality of normal memory mats is performed at the same time as the refresh operation for the edge memory mat.

* * * * *